United States Patent
Diekmann et al.

(10) Patent No.: US 11,196,027 B2
(45) Date of Patent: Dec. 7, 2021

(54) LIGHT-EMITTING APPARATUS AND METHOD FOR PRODUCING A LIGHT-EMITTING APPARATUS

(71) Applicant: PICTIVA DISPLAYS INTERNATIONAL LIMITED, Dublin (IE)

(72) Inventors: Karsten Diekmann, Rattenberg (DE); Thorsten Vehoff, Regensburg (DE); Ulrich Niedermeier, Leiblfing (DE); Andreas Rausch, Regensburg (DE); Daniel Riedel, Regensburg (DE); Nina Riegel, Tegernheim (DE); Thomas Wehlus, Lappersdorf (DE)

(73) Assignee: PICTIVA DISPLAYS INTERNATIONAL LIMITED, Dublin (IE)

( * ) Notice: Subject to any disclaimer, the term of this patent is extended or adjusted under 35 U.S.C. 154(b) by 0 days.

(21) Appl. No.: 15/543,931

(22) PCT Filed: Feb. 2, 2016

(86) PCT No.: PCT/EP2016/052179
§ 371 (c)(1),
(2) Date: Jul. 14, 2017

(87) PCT Pub. No.: WO2016/124594
PCT Pub. Date: Aug. 11, 2016

(65) Prior Publication Data
US 2017/0358777 A1    Dec. 14, 2017

(30) Foreign Application Priority Data
Feb. 5, 2015 (DE) .......................... 102015101683.4

(51) Int. Cl.
H01L 51/52 (2006.01)
H01L 51/00 (2006.01)
H01L 51/56 (2006.01)

(52) U.S. Cl.
CPC ...... H01L 51/5268 (2013.01); H01L 51/0097 (2013.01); H01L 51/5275 (2013.01);
(Continued)

(58) Field of Classification Search
CPC . H01L 51/5268; H01L 51/56; H01L 51/0097; H01L 51/5275; H01L 2251/5338;
(Continued)

(56) References Cited

U.S. PATENT DOCUMENTS 6,465,953 B1 * 10/2002 Duggal ................. H01L 25/046
313/553
7,011,420 B2    3/2006 Cok
(Continued)

FOREIGN PATENT DOCUMENTS

DE    102007032280 A1    12/2008
DE    102009025123 A1    12/2010
(Continued)

Primary Examiner — Samuel Park
(74) Attorney, Agent, or Firm — Botos Churchill IP Law LLP (57) ABSTRACT

An light-emitting apparatus and a method for producing a light-emitting apparatus are disclosed. In an embodiment, the apparatus includes at least one organic device and an outcoupling layer, wherein the at least one organic device emits electromagnetic radiation during operation, wherein the outcoupling layer contains optical structures, and wherein the apparatus has a non-Lambertian radiation distribution curve during operation. The outcoupling layer influences the radiation passing through it in an optically (Continued)

varying manner by the optical structures along a lateral direction in order to produce the non-Lambertian radiation distribution curve.

21 Claims, 6 Drawing Sheets

(52) U.S. Cl.
CPC .......... *H01L 51/56* (2013.01); *H01L 51/5265* (2013.01); *H01L 2251/5338* (2013.01); *H01L 2251/5346* (2013.01)

(58) Field of Classification Search
CPC ......... H01L 51/5265; H01L 2251/5346; H01L 27/124; H01L 27/127; H01L 27/1262; H01L 27/1248; H01L 21/77; H01L 27/12; H01L 27/14603; H01L 27/14605; H01L 27/14609; H01L 27/14812; H01L 27/3248; H01L 27/326; H01L 2021/775; H01L 27/1214; H01L 27/3232
See application file for complete search history.

(56) References Cited

U.S. PATENT DOCUMENTS

| | | | |
|---|---|---|---|
| 7,527,398 B2 | 5/2009 | Song et al. | |
| 7,982,387 B2 | 7/2011 | Krummacher et al. | |
| 9,337,447 B2 | 5/2016 | Krummacher et al. | |
| 9,343,704 B2 | 5/2016 | Setz et al. | |
| 9,373,819 B2 | 6/2016 | Riegel et al. | |
| 9,490,452 B2 | 11/2016 | Schwamb et al. | |
| 2010/0170800 A1* | 7/2010 | Son | C01B 32/168 205/50 |
| 2010/0326519 A1* | 12/2010 | Tanase | B82Y 20/00 136/257 |
| 2012/0037943 A1 | 2/2012 | Verschuren et al. | |
| 2014/0217370 A1* | 8/2014 | Kim | H01L 51/5275 257/40 |
| 2014/0233194 A1* | 8/2014 | Hongo | H05K 1/0283 361/749 |
| 2014/0264316 A1* | 9/2014 | Setz | H01L 51/0035 257/40 |
| 2014/0284557 A1* | 9/2014 | Choi | H01L 51/5268 257/40 |
| 2014/0306260 A1* | 10/2014 | Yamazaki | H01L 51/5012 257/99 |
| 2015/0194632 A1 | 7/2015 | Schwamb et al. | |
| 2015/0264774 A1* | 9/2015 | Kaneko | H05B 45/60 315/158 |
| 2015/0368553 A1 | 12/2015 | Nelson et al. | |
| 2016/0164037 A1 | 6/2016 | Wehlus et al. | |
| 2016/0365393 A1* | 12/2016 | Kim | H01L 27/322 |

FOREIGN PATENT DOCUMENTS

| | | | |
|---|---|---|---|
| DE | 102011086168 A1 * | 5/2013 | ......... H01L 51/5268 |
| DE | 102011086168 A1 | 5/2013 | |
| DE | 102012204934 A1 | 10/2013 | |
| DE | 102012210876 A1 | 1/2014 | |
| DE | 102013106804 A1 | 12/2014 | |
| DE | 102013106985 A1 | 1/2015 | |
| DE | 102013108039 A1 | 1/2015 | |
| JP | 2009211885 A | 9/2009 | |
| JP | 2009251325 A | 10/2009 | |
| JP | 2010171349 A | 8/2010 | |
| JP | 5343389 B2 | 11/2013 | |
| WO | 2007049213 A2 | 5/2007 | |
| WO | 2014001046 A1 | 1/2014 | |

* cited by examiner

LIGHT-EMITTING APPARATUS AND METHOD FOR PRODUCING A LIGHT-EMITTING APPARATUS

This patent application is a national phase filing under section 371 of PCT/EP2016/052179, filed Feb. 2, 2016, which claims the priority of German patent application 10 2015 101 683.4, filed Feb. 5, 2015, each of which is incorporated herein by reference in its entirety.

TECHNICAL FIELD

A light-emitting apparatus and a method for producing a light-emitting apparatus are specified.

BACKGROUND

Organic light-emitting diodes are typically Lambert radiators. However, a radiation characteristic is often desired that compared with a Lambert radiator has a stronger radiation in a forward direction. This can be advantageous, for example, for the realization of a specific light planarization or for glare suppression.

SUMMARY OF THE INVENTION

Embodiments of the invention provide an apparatus with flexibly configurable directed light distribution curves. Further embodiments of the invention provide a reliable and simplified method for producing a light-emitting apparatus.

According to at least one embodiment of an apparatus, this has at least one organic device, which emits electromagnetic radiation in particular during operation. The device can have a substrate and an organic functional layer stack arranged on the substrate. The functional layer stack can contain a plurality of organic layers, in particular exclusively organic layers. For example, the functional layer stack has a first charge transport layer, an organic layer executed for instance as a hole transport layer, and a second charge transport layer, an organic layer formed for instance as an electron transport layer. An active organic layer can be arranged in a vertical direction between the charge transport layers, which organic layer emits electromagnetic radiation in the ultraviolet, visible or infrared spectral range, for example, during operation of the device. For example, the device is an organic light-emitting diode (OLED).

A vertical direction is understood to mean a direction that is aligned in particular perpendicular to a main extension surface of the organic active layer. The main extension surface can be formed level or curved in this case. A lateral direction is understood to mean a direction that runs in particular parallel to the main extension plane of the organic active layer. The vertical direction and the lateral direction are locally directed transversely to one another, for example, perpendicular to one another.

The substrate is preferably formed from a radiation-permeable, for instance transparent, material. The substrate can be formed to be flexible, in particular elastically pliant or elastically extensible. The substrate can contain glass or a vitreous material or consist of this. The substrate has a first main surface facing away from the functional layer stack, which serves as a radiation exit surface of the device, for example.

According to at least one embodiment of the apparatus, this has an outcoupling layer. The outcoupling layer can be embedded in the substrate. Alternatively the outcoupling layer can be arranged as a separate layer on the side of the first main surface of the substrate or be arranged spaced at a distance from the device. This means that the outcoupling layer can be executed with respect to the organic device as an internal or external outcoupling layer. An external outcoupling layer is a separate layer, for example, which is produced in particular separately from the organic device. The prefabricated, external outcoupling layer can be formed, for example, as a film, which is applied to the device. The outcoupling layer of the apparatus can be formed in this case in one-piece or in several pieces. It is also possible that the apparatus has both an internal sub-region of the outcoupling layer and an external sub-region of the outcoupling layer. In such case the possibility exists in particular of combining the internal and external outcoupling effect with one another.

The outcoupling layer can have a plurality of optical structures, which influence the radiation passing through the outcoupling layer optically, for instance scatter, reflect, bend or refract it. The optical structures can be scattering centers in this case, for instance scatter particles, or elevations or depressions of a surface of the outcoupling layer. The optical structures can be formed further as microlenses.

According to at least one embodiment of the apparatus, this has a non-Lambertian radiation distribution curve during operation. To produce the non-Lambertian radiation distribution curve, the outcoupling layer influences the radiation passing through it in a varying manner optically in particular by means of the optical structures along a lateral direction, meaning locally in a different manner optically, for example. In particular, the radiation passing through the outcoupling layer is scattered or deflected by the optical structures.

A Lambertian radiation distribution curve is understood to mean in particular a radiation distribution curve of a Lambert radiator or an approximately Lambert radiator, in which a directional characteristic, in particular the intensity, is directly proportional to the cosine of an observation angle. Such a radiator appears equally bright from all observation angles, meaning in particular with equal luminance. A non-Lambertian radiation distribution curve is understood to mean a curve which differs from the form of a cosine curve. For example, the apparatus has a radiation characteristic with a non-Lambertian radiation distribution curve with reference to a distribution of radiation intensity per angle unit, wherein the radiation distribution curve takes the form of a $\cos^n(\varphi)$ curve and n is a number greater than 1, for instance greater than 1.2 or 1.5. For example, n is a number between 1.2 and 4 inclusive or between 1.5 and 4 inclusive, for instance between 2 and 4 inclusive. The angle $\varphi$ is in a range between $-90°$ and $+90°$, for example.

In at least one embodiment of the apparatus, the apparatus has at least one organic device and an outcoupling layer. The at least one organic device emits electromagnetic radiation during operation. The outcoupling layer contains optical structures. During operation the apparatus has a non-Lambertian radiation distribution curve, wherein to produce the non-Lambertian radiation distribution curve the outcoupling layer influences the radiation passing through it in a varying manner optically by means of the optical structures along a lateral direction.

The global radiation distribution curve, thus the overall radiation characteristic of the apparatus, is thus significantly determined in particular by the nature of the outcoupling layer, in particular by the distribution of the optical structures of the outcoupling layer. A desired radiation distribution curve of the apparatus can thus be flexibly adjusted by appropriate design of an outcoupling layer produced in particular separately from the device, due to which a factory flexibility in the setting of different light distribution curves is advantageously increased. For example, a plurality of different radiation distribution curves can be achieved variably on the basis of one and the same device, for example, one and the same OLED, by different configurations of the outcoupling layer. Furthermore, compared with conventional methods for forming the desired radiation characteristic, reflectors or glare suppression lamellae can be eliminated, for instance, due to which the apparatus can be designed as a whole especially thin.

According to at least one embodiment of the apparatus, the at least one organic device has an optical cavity, on account of which the device radiates electromagnetic radiation during operation in a focused forward direction and thus in a non-Lambertian manner. This means that the organic device can already have a radiation characteristic with a radiation distribution curve that deviates from the Lambertian radiation distribution curve solely on account of its optical cavity. The setting of the optical cavity can be realized, for example, by adjustment of refraction indices of the adjacent layers of the device.

According to at least one embodiment of the apparatus, the outcoupling layer has, at least in regions, a gradient along a lateral direction with regard to a local scatter effect or a local directional effect of the outcoupling layer. In this case the outcoupling layer can have a continuous gradient progression or a discontinuous gradient progression at least in regions. In a continuous gradient progression, a characteristic value, for instance the degree of scatter effect or the degree of directional effect of the outcoupling layer, increases or decreases steadily along a lateral direction. In a discontinuous gradient progression, on the other hand, such a value increases or decreases in jumps. The scatter effect or the directional effect can take different values in particular even in sub-regions of the outcoupling layer that are discretely delimited from one another. Even several organic devices that are associated with different sub-regions of the outcoupling layer can be assembled to an overall surface, for instance an overall light exit surface, of the apparatus.

The distribution of the optical structures in the outcoupling layer can be described by the distribution of characteristic magnitudes such as the concentration, for example, the geometrical magnitudes or the material composition. Here the forms of the optical structures can be formed differently.

According to at least one embodiment of the apparatus, a distribution of the optical structures of the outcoupling layer varies with regard to their concentration. The local variation of the concentration of the optical structures can lead to a local change in the scatter effect or the directional effect of the outcoupling layer along the lateral direction, for example. In particular, the outcoupling layer can have a gradient with regard to the density distribution of the optical structures.

According to at least one embodiment of the apparatus, a distribution of the optical structures varies locally with regard to their mean size. The mean size is in particular an average value of the geometrical sizes of the structures in a predetermined volume unit or area unit. The geometrical size of the structures can be a vertical height, a lateral width, a diameter or a maximum spatial extension of the respective optical structures. The outcoupling layer can also have a gradient with regard to the mean size of the optical structures along a spatial direction, for example, along the lateral direction.

According to at least one embodiment of the apparatus, a material composition of the optical structures varies locally, for example, along the lateral direction. The respective optical structures or groups of optical structures can be formed of various materials. Different scatter effects and/or different directional effects can thereby be achieved in different regions of the outcoupling layer.

According to at least one embodiment of the apparatus, the outcoupling layer is formed as a scattering layer at least in regions or as a whole. The optical structures of the scattering layer can be scatter particles. The locally different scatter effects of the outcoupling layer can be achieved by a concentration of the scatter particles in the outcoupling layer changing locally. Furthermore, a geometrical size, for example, a mean diameter, of the scatter particles can vary locally. To achieve locally varying scatter effects, a material composition of the scatter particles, meaning a materiality of the scatter particles, can be varied in the scattering layer. For example, the scatter particles can be formed partly from titanium oxide, for example, titanium dioxide, and partly from zirconium oxide, for example, zirconium dioxide, or partly from another material. The locally varying scatter effects can also be achieved by various combinations of changes in the concentration, the size and the materiality of the scatter particles.

According to at least one embodiment of the apparatus, the outcoupling layer is formed at least in regions or as a whole as a microlens layer. The optical structures can be microlenses in this case. With a microlens layer a variation of the local directional effect of the outcoupling layer can be achieved in a simplified manner. For example, the microlenses can be configured so that they have different geometrical sizes, for example, diameter, height or width. A surface occupancy of the different optical structures can also be different. For example, surfaces that are covered by the different microlenses can be of a different size. Even a concentration of the microlenses can vary along the lateral direction. Furthermore, the microlenses can have different shapes or focal lengths, so that the directional effect of the outcoupling layer that is achieved is locally different. The locally varying directional effect of the outcoupling layer can likewise be achieved by combinations of the changes in shapes, geometrical sizes and/or the respectively different surface occupancy of the optical structures.

According to at least one embodiment of the apparatus, the outcoupling layer can be formed as a film. In particular, the film is produced separately from the organic device. This means that the outcoupling layer can be prefabricated and be arranged on the organic device, for example. The film with the optical structures can thus be produced in a simplified manner and then applied to the device. A film is understood in particular to be a self-supporting layer, the vertical height of which is smaller by a multiple than its lateral extension, for example, at least 5 times, at least 10 times, at least 50 times or at least 100 times smaller. In particular, the film is a layer that is formed pliantly under the influence of its own weight.

According to at least one embodiment of the apparatus, the at least one organic device is formed to be pliant, for example, elastically pliant. In particular, the organic device has a curved radiation exit surface. The substrate and/or the functional layer stack can each be formed curved in this case. In particular, the substrate of the organic device is formed of a flexible, in particular of an elastic material. The organic device can thus have a curved shape, due to which a directed radiation characteristic with a non-Lambertian radiation distribution curve is simple to realize.

According to at least one embodiment of the apparatus, this has a plurality of organic devices. The organic devices are in particular spaced apart laterally. For example, the organic devices are arranged obliquely to one another. The outcoupling layer can have a plurality of sub-regions spaced apart. The sub-regions of the outcoupling layer can each be associated with an organic device. It is also possible for the outcoupling layer to be formed continuously and for the organic devices that are spaced apart to be arranged on different sub-regions of the outcoupling layer. The organic devices can be formed rigid or flexible in this case.

The sub-regions of the outcoupling layer can have different scatter effects or directional effects. The sub-regions can also each have a gradient, at least in regions, with regard to the scatter effect and/or the directional effect. In particular, the devices with the associated sub-regions of the outcoupling layer can be arranged so that the locally different scatter effects or directional effects of the different sub-regions are executed as a gradient of the outcoupling layer. In particular, the scatter effect or the directional effect changes at least in regions in a continuous progression over a surface of the outcoupling layer. A degree of the scatter effect or the directional effect can also take different values in sub-regions of the outcoupling layer that are discretely delimited from one another.

Furthermore, different devices with different sub-regions with regard to the scatter effect and/or the directional effect can be arranged in such a way that their radiation exit surfaces are assembled into an overall surface, for example, into an overall radiation exit surface of the apparatus. The overall surface in this case can be executed curved, in particular semi-cylindrically, wherein the overall surface can be formed continuous or in several parts and discretely. The sub-regions of the outcoupling layer can be configured in regions as a scattering layer and in regions as a micro-optics layer. It is also possible that all sub-regions of the outcoupling layer are each formed as a scattering layer or each as a micro-optics layer.

According to at least one embodiment of the apparatus, the at least one organic device has a roughened radiation exit surface, the roughness of which varies locally. The radiation exit surface can be formed here by a surface of the substrate of the device or by a surface of the outcoupling layer. It is also possible for the outcoupling layer to be formed as the substrate of the device. The optical structures of the outcoupling layer can thus be formed in regions by the roughened radiation exit surface. The roughened radiation exit surface can thus contribute to the variation of the scatter effect and/or the directional effect of the outcoupling layer.

In at least one embodiment of a method for producing an apparatus, at least one organic device is provided, which emits electromagnetic radiation during operation. An outcoupling layer with a plurality of optical structures is formed, so that during operation the apparatus produces a non-Lambertian radiation distribution curve, wherein to produce the non-Lambertian radiation distribution curve, the outcoupling layer influences the radiation passing through it in a varying manner optically by means of the optical structures along a lateral direction.

The radiation distribution curve should be considered in particular globally in this case. Viewed locally, a Lambertian and/or a non-Lambertian characteristic can be produced by the outcoupling layer in regions. This means that the global non-Lambertian radiation distribution curve is in particular a superimposition of local radiation distribution curves, wherein the local radiation distribution curves can differ from one another. To produce varying local radiation distribution curves, the outcoupling layer is executed in respect of its character in particular in such a way that the outcoupling layer produces different varying local radiation distribution curves for the radiation passing through it at various points.

In particular, the outcoupling layer can be formed as a scattering layer. The optical structures can be formed by scatter particles. In particular, to form the optical structures, the scatter particles are introduced into the outcoupling layer by a printing process, for instance by inkjet printing. In particular, the scatter particles are formed in the outcoupling layer in such a way that the outcoupling layer has a gradient with regard to the scatter effect.

Alternatively, the outcoupling layer can be formed as a microlens layer. The optical structures can be microlenses in this case, wherein the optical structures are formed, for example, by an embossing process, in particular by a thermal embossing process.

According to at least one embodiment of the method, the outcoupling layer is formed in the form of a film. The outcoupling layer can thus be produced separately from the organic device. The prefabricated outcoupling layer can be applied to the organic device under thermal influence or by means of a connecting layer.

According to at least one embodiment of a method, a radiation exit surface of the organic device is structured so that the radiation exit surface has varying roughness locally, in particular along the lateral direction. For example, the radiation exit surface is roughened by an etching process or by sandblasting.

The method described in the present application is especially suitable for the production of an apparatus described above. Features described in connection with the apparatus can therefore also be used for the method and vice versa.

BRIEF DESCRIPTION OF THE DRAWINGS

Other advantages, preferred embodiments and developments of the device and of the method result from the embodiments explained below in connection with FIGS. 1 to 11B. These show:

FIG. 9 shows a schematic representation of various radiation distribution curves and FIGS. 10A to 11B show schematic representations of embodiments of an apparatus with a plurality of organic devices and simulated radiation distributions for the various embodiments.

Identical and similar elements or elements having the same effect are provided with the same reference signs in the figures. The figures are schematic representations in each case and therefore not necessarily true to scale. On the contrary, comparatively small elements and in particular layer thicknesses can be shown exaggeratedly large for clarification purposes.

DETAILED DESCRIPTION OF ILLUSTRATIVE EMBODIMENTS

Figure 1:
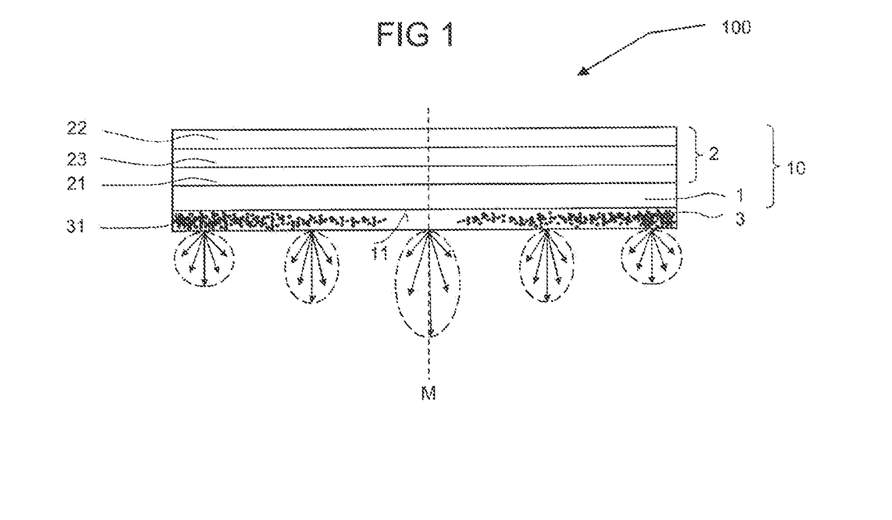
FIGS. 1 to 3 show schematic representations of various embodiments of an apparatus with an organic device.

FIG. 1 shows an apparatus 100 with a device 10 and an outcoupling layer 3. The device 10 is an organic light-emitting diode in particular. The device 10 has a substrate 1 and a functional layer stack 2 arranged on the substrate.

The functional layer stack has an organic active layer 23. The active layer 23 emits electromagnetic radiation during operation of the device, for example. The layer stack 2 also contains a first charge transport layer 21 and a second charge transport layer 22, wherein the organic active layer 23 is arranged between the first charge transport layer 21 and the second charge transport layer 22.

The device 10 has a radiation exit surface 11. In FIG. 1, the radiation exit surface 11 is formed by a surface of the substrate 1 facing away from the layer stack 2. The outcoupling layer 3 is arranged on the side of the radiation exit surface 11 on the device 10. The outcoupling layer 3 has a plurality of optical structures 31. The outcoupling layer 3 has a central axis M running vertically. In particular, the central axis M runs through a geometrical center point or through a center of mass of the outcoupling layer 3.

The outcoupling layer 3 is formed in particular as a scattering layer. The optical structures 31 are in particular scatter particles. In particular, the outcoupling layer 3 has approximately from the central axis M along a lateral direction, for instance up to a lateral edge-region of the outcoupling layer 3, a gradient with regard to a local scatter effect of the outcoupling layer 3. In particular, the gradient has a continuous progression.

In FIG. 1, the outcoupling layer 3 has a gradient along the lateral direction from the central axis M to an edge region in particular with a continuous gradient progression with regard to a concentration of the optical structures 31. From the central axis M to the lateral edge-region the scatter effect increases in particular steadily. This means that the scatter effect in the immediate vicinity of the central axis M is at its smallest and the scatter effect of the outcoupling layer 3 is greatest at the edge-regions. Alternatively to variation of the concentration of the optical structures, in particular of the scatter particles, a different local scatter effect of the outcoupling layer 3 can be achieved by variations of the size of the scatter particles or by changes in the materiality of the scatter particles, or by various combinations of the variations of the concentration, the size and the materiality of the scatter particles.

The organic device shown in FIG. 1 has an optical cavity, on account of which the device 10 radiates electromagnetic radiation in a directed forward direction. In FIG. 1 the substrate 1, through which the electromagnetic radiation produced by the active layer 23 passes during operation of the device, is formed to be radiation-permeable. This is a so-called bottom emitter. Diverging from FIG. 1, the device can be formed as a top emitter and/or as a flexible, for example, pliant device. In a top emitter the substrate is in particular impermeable to radiation. The substrate is a metal foil, for example. The outcoupling layer 3 can then be arranged on a side of the layer stack 2 facing away from the substrate. A transparent encapsulation layer can be arranged between the layer stack 2 and the outcoupling layer 3.

The scatter effect of the outcoupling layer is at its lowest in the immediate vicinity of the central axis M and can go towards 0. The apparatus 100 has a local radiation characteristic in this region which is directed and non-Lambertian. The scatter effect increases in particular steadily from the central axis M to the lateral edge-regions of the outcoupling layer 3. The radiation characteristic of the apparatus thus changes from the central axis M along the radial direction up to the edge-regions of the outcoupling layer 3 from a non-Lambertian radiation distribution to a Lambert-like radiation distribution.

The sum or the superimposition of the local radiation characteristics along the outcoupling layer leads to an overall radiation that is non-Lambertian. The apparatus 100 shown in FIG. 1 thus has a non-Lambert radiation distribution curve during operation, wherein to produce the non-Lambert radiation distribution curve the outcoupling layer 3 influences the radiation passing through it in a varying manner optically along the lateral direction by means of the distribution of optical structures. With such an outcoupling layer 3 the radiation characteristic of the apparatus 100 can be configured flexibly in the case of a predetermined device 10 by means of an appropriate design of the optical structures 31, due to which a factory flexibility in the setting of different light distribution curves is increased.

Figure 2:
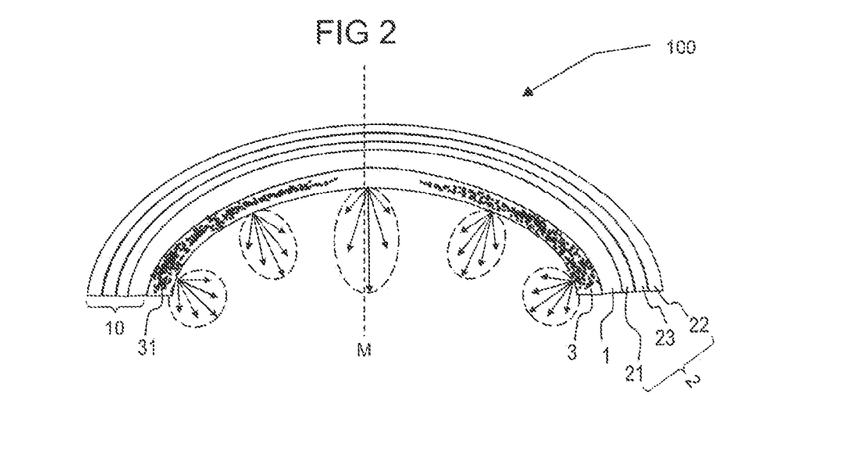

Another embodiment of an apparatus is shown in FIG. 2. This embodiment substantially corresponds to the embodiment shown in FIG. 1. In contrast to this, the organic device 10 is formed flexibly. In particular, the device 10 is formed to be pliant, in particular elastically pliant. The device 10 has a curved radiation exit surface 11, which is formed, for example, by a surface of the substrate 1 facing away from the functional layer stack 2. The outcoupling layer 3 is arranged on the radiation exit surface 11 and in particular adjoins the radiation exit surface 11. The radiation exit surface 11 is curved in a concave manner in this case. In particular, the device 10 can take the shape of a half-cylinder. A particularly directed radiation characteristic of the apparatus 100 can be achieved with a flexible organic device.

Figure 3:
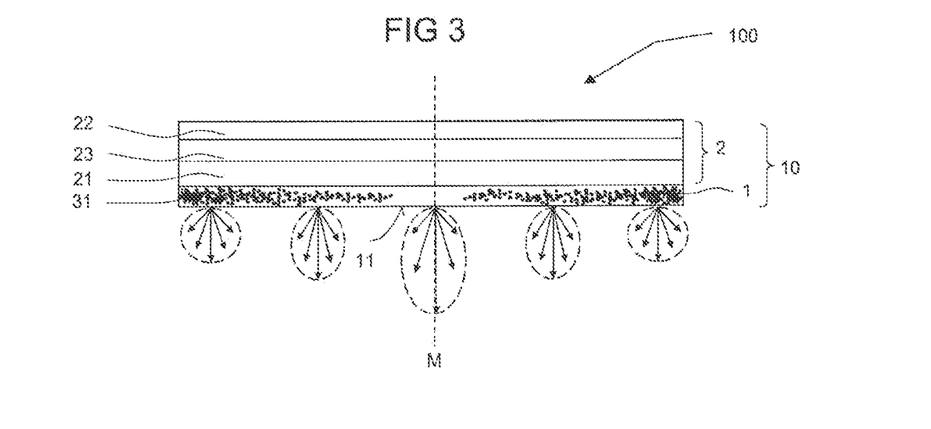

In FIG. 3 another embodiment of an apparatus is shown, which corresponds substantially to the embodiment shown in FIG. 1. In contrast to FIG. 1, in which the apparatus 100 has an external outcoupling layer 3, the outcoupling layer 3 shown in FIG. 3 is executed as an internal outcoupling layer 3. While the outcoupling layer 3 in FIG. 1 is arranged on the radiation exit surface 11 and thus outside of the organic device 10, the optical structures 31 according to FIG. 3 are embedded in the substrate 1 of the device 10. It is also possible to arrange the outcoupling layer 3 between the substrate 1 and the layer stack 2, for example, between the substrate and the first charge transport layer 21. Apart from this, it is also possible that the apparatus 100 has both an internal outcoupling layer 3 and an external outcoupling layer 3. In such cases the possibility exists in particular of combining internal and external outcoupling effect with one another.

Figure 4:
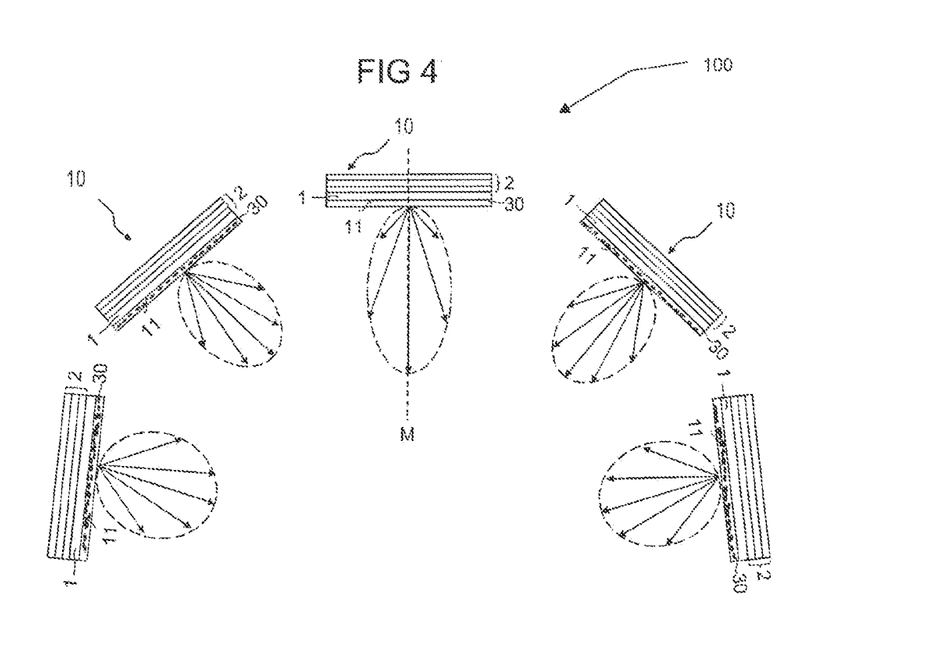
FIG. 4 shows a schematic representation of an apparatus with a plurality of organic devices.

An apparatus 100 with a plurality of organic devices 10 is shown in FIG. 4. The outcoupling layer 3 has a plurality of sub-regions 30 spaced apart at a distance. The sub-regions 30 are each associated with an organic device 10. The devices 10 are formed in particular as rigid devices. The scatter effect of the outcoupling layer 3 can take different values, for example, in sub-regions 30 discretely delimited from one another. In FIG. 4 the sub-region 30, which is associated with the centrally arranged organic device 10, has the smallest scatter effect, which can even go towards 0. The organic devices 10, in particular the organic devices 10 adjacent to one another, are arranged obliquely to one another. They thus form a three-dimensional arrangement of the devices 10. Together they form a geometrical shape, for example, which is similar to a half-cylinder.

The sub-regions 30 have a growing scatter effect from the central axis M up to a lateral edge-region of the outcoupling layer 3. The devices 10 can have a forward direction in the radiation characteristic on account of their respective optical cavity. Due to the growing scatter effect, the local radiation characteristic of the apparatus changes from a non-Lambertian to a Lambert-like radiation characteristic at the edge-regions. The apparatus 100 described in FIG. 4 thus has an overall radiation characteristic that corresponds to an overall radiation characteristic of the apparatus described in FIG. 2.

Figure 5:
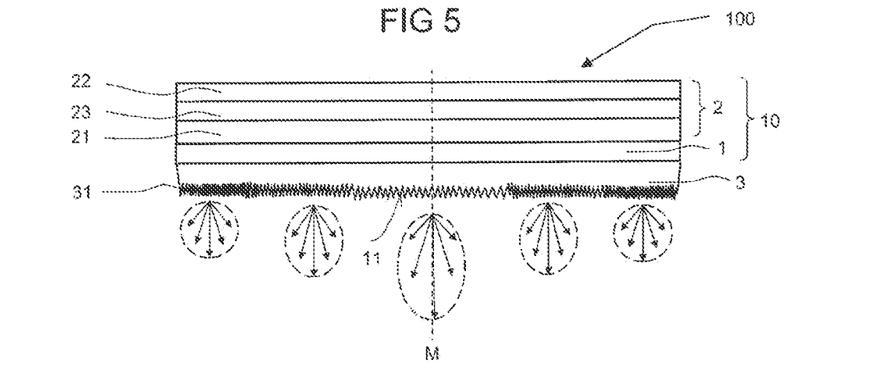
FIGS. 5 to 7 show schematic representations of other embodiments of an apparatus with an organic device.

The embodiment shown in FIG. 5 substantially corresponds to the embodiment of an apparatus shown in FIG. 1. In contrast to this, the organic device 10 has a roughened radiation exit surface 11, the roughness of which varies locally. Unlike FIG. 1, in which the local variation of the scatter effect of the scattering layer 3 is achieved by the scatter particles, the local variation of the scatter effect can also be achieved by variation of the roughness of the radiation exit surface. A combination of the variation of the roughness and the variation of the design of the scatter particles is likewise possible.

Figure 6:
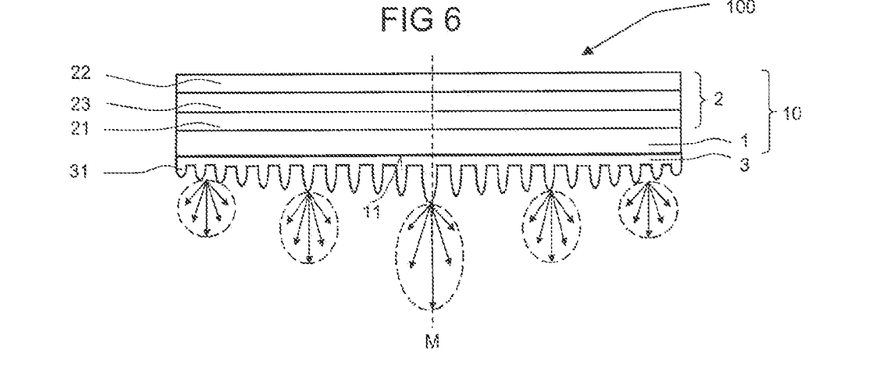

The embodiment of an apparatus shown in FIG. 6 substantially corresponds to the embodiment shown in FIG. 1. In contrast to this, the outcoupling layer 3 has a locally varying directional effect. For example, the outcoupling layer is a micro-optics layer, formed, for example, as a microlens layer, wherein the optical structures 31 can be microlenses. In a pure use of a micro-optics layer, in particular of microlenses, it is not necessary that the device 10 has an optical cavity, which radiates directed light from the outset. This means that the device 10 can be a Lambert radiator, for example. However, on account of the outcoupling layer 3 the apparatus has a non-Lambert radiation distribution curve.

The different local directional effect of the micro-optics layer can be achieved, for example, by different configuration of the microlenses with regard to their shapes, focal lengths, geometrical sizes such as heights and widths or with regard to the area occupancy of the respective microlenses or combinations of these. The density and/or arrangement pattern, for instance hexagonal, square etc., are meant by the area occupancy, for example. The outcoupling layer 3 shown in FIG. 6 has a decreasing, in particular steadily decreasing, directional effect from the central axis M along the lateral direction up to an edge-region of the outcoupling layer 3. The outcoupling layer 3 thus has a gradient with regard to the directional effect along a radial direction.

Figure 7:
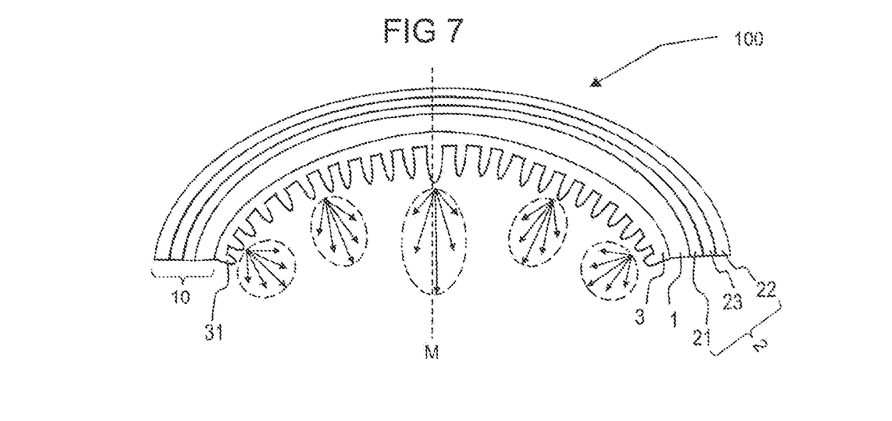

By analogy with FIG. 2, the apparatus shown in FIG. 7 has a flexibly formed device 10. The outcoupling layer 3 with the microlenses is formed curved. By analogy with FIG. 6, the outcoupling layer 3 in FIG. 7 has a continuous gradient progression with regard to the directional effect, at least in regions, along the lateral direction.

Figure 8:
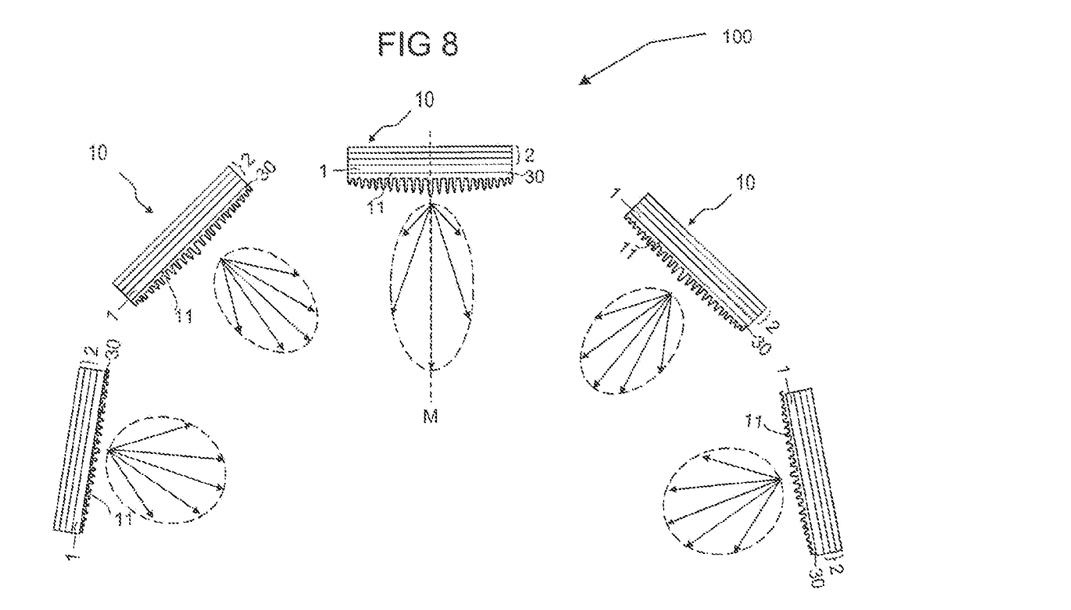
FIG. 8 shows a schematic representation of another embodiment of an apparatus with a plurality of organic devices.

The embodiment shown in FIG. 8 of an apparatus with a plurality of devices 10 spaced apart from one another corresponds substantially to the embodiment shown in FIG. 4. In contrast to this, the sub-regions 30 of the outcoupling layer 3 of the apparatus 100 each have a gradient with regard to a local directional effect of the sub-regions 30 and the outcoupling layer 3, at least in regions. It is also possible that sub-regions 30 with a locally varying scatter effect and sub-regions with a locally varying directional effect are combined with one another. This means that the outcoupling layer 3 can contain sub-regions 30 that have a gradient with regard to the scatter effect, for example, and contain other sub-regions 30 that have a gradient with regard to the directional effect, for example.

Figure 9:
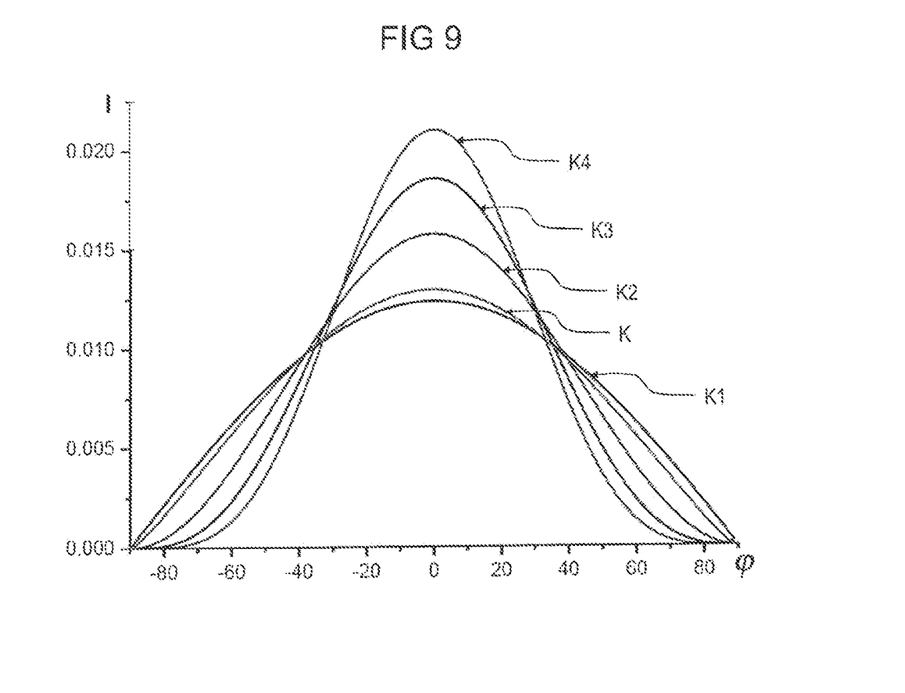

Various radiation distribution curves K and K1 to K4 are shown in FIG. 9. The curves each describe the radiation intensity I per angle unit φ. The curve K1 corresponds to a $\cos(\varphi)$ distribution and thus a Lambertian radiation distribution curve. The curves K2, K3 and K4 are $\cos^2(\varphi)$, $\cos^3(\varphi)$ and $\cos^4(\varphi)$ curves. The curve K represents a radiation distribution curve of a white organic light-emitting diode with an outcoupling layer 3 formed as a scattering layer. In all distributions K and K1 to K4 the overall intensity is of the same magnitude. In other words, the areas below the respective curves are of the same size. The higher the cosine power, the more directed the radiation characteristic.

Figure 10A:
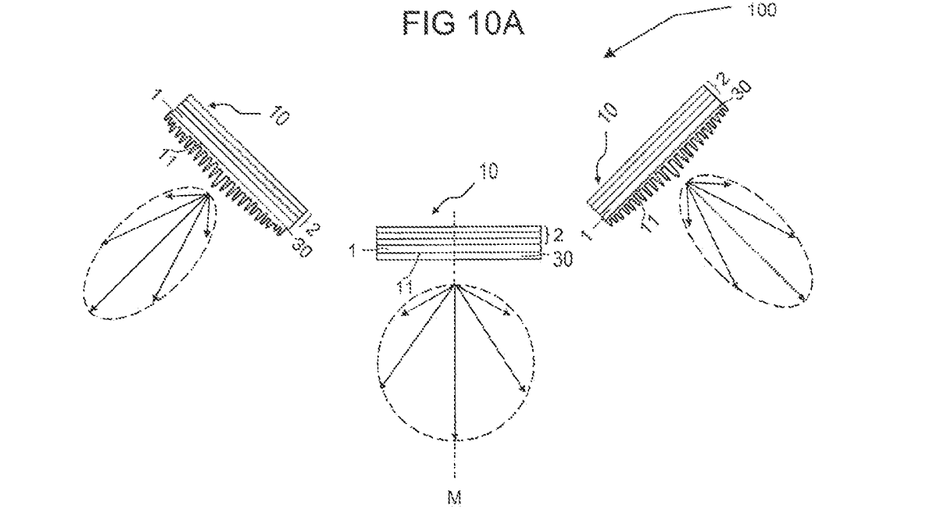

In FIG. 10A an apparatus 100 is shown with three organic devices 10. The centrally arranged organic device 10 has a Lambertian or Lambert-like radiation distribution curve. A first sub-region 30 of the outcoupling layer 3 is associated with this centrally arranged device 10, wherein the first sub-region 30 has no or a particularly small scatter effect or directional effect. The two outer organic devices 10 can have a Lambertian or Lambert-like radiation distribution curve respectively. However, another sub-region 30 is associated with the outer organic device 10, which region has a locally varying directional effect. The radiation passing through the outer sub-regions 30 is thus influenced locally in an optically different manner by the sub-regions 30 on account of the variation of the directional effect, so that the outer devices 10 with the associated sub-regions 30 each produce a non-Lambertian radiation distribution curve.

The three organic devices 10 have respectively one radiation exit surface 11, wherein the radiation exit surface 11 of the centrally arranged device 10 forms with the radiation exit surfaces 11 of the outer organic devices 10 respectively a reflex angle, for example, an angle of 225°.

Figure 10B:
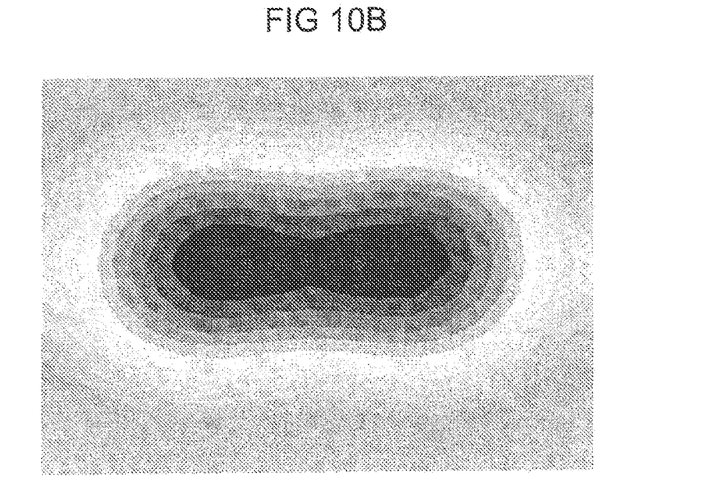

In FIG. 10B a radiation distribution of the apparatus 100 described in FIG. 10A is shown. Dark grey shades correspond in FIG. 10B to a higher radiation intensity than light grey tones. The maximum of the radiation intensity lies on the central axis. Starting out from the central axis M, the radiation intensity falls in each direction perpendicular to the central axis M in particular continuously, but at a different rate. Along a lateral direction on which the devices 10 are arranged, the radiation distribution has an elongated extended region with a higher radiation intensity than its surroundings. Such an apparatus wo is especially suitable for an illumination of a rectangular object with a different length and width, for example. The object is a conference table, for example.

Figure 11A:
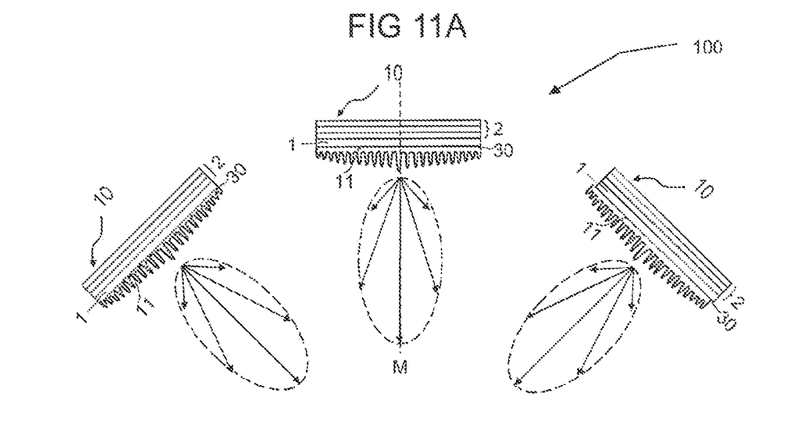

The embodiment shown in FIG. 11A substantially corresponds to the embodiment shown in FIG. 10A. In contrast to this, all three sub-regions 30 have locally varying directional effects. The radiation exit surface 11 of the centrally arranged device 10 forms with the radiation exit surfaces 11 of the outer organic devices 10 respectively an obtuse angle, for instance an angle of 135°.

Figure 11B:
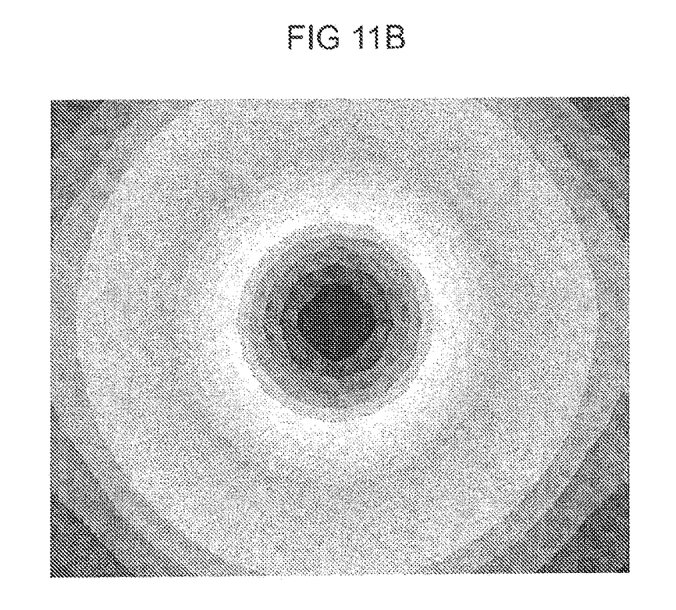

In FIG. 11B a radiation distribution of the apparatus 100 described in FIG. 11A is shown. The maximum of the radiation intensity lies on the central axis M, wherein the radiation intensity declines, starting out from the central axis M, substantially equally fast in all directions perpendicular to the central axis M. Such an apparatus wo is especially suitable for focusing of a light bundle, for example, as a spotlight.

Apart from the sub-regions 30 in FIGS. 10A and 11A, the outcoupling layer 3 can also have sub-regions 30 with a locally varying scatter effect or sub-regions 30 with different scatter effects.

The invention is not limited by the description of the invention with reference to the embodiments to this description. On the contrary, the invention comprises every new feature and every combination of features, which includes in particular every combination of features in the claims, even if this feature or this combination is not itself explicitly specified in the claims or embodiments.

The invention claimed is:

1. An apparatus comprising:
   an organic device with an optical cavity; and
   an outcoupling layer;
   wherein the optical cavity is configured to cause the organic device, during operation, to emit electromagnetic radiation through a radiation exit surface of the organic device, the electromagnetic radiation being focused in a forward direction perpendicular to a surface of the outcoupling layer facing away from the radiation exit surface;
   wherein the radiation exit surface is a main surface of the organic device;
   wherein the outcoupling layer contains optical structures;
   wherein the apparatus has a non-Lambertian radiation distribution curve during operation;
   wherein the outcoupling layer influences the radiation passing through it in an optically varying manner by the optical structures along a lateral direction in order to produce the non-Lambertian radiation distribution curve;
   wherein a radiation distribution of the focused electromagnetic radiation includes a central region with a higher radiation intensity than its surroundings, and
   wherein the radiation distribution of the focused electromagnetic radiation takes a shape of a $\cos^n(\varphi)$ curve, $\varphi$ being an observation angle in an interval between $-90°$ and $90°$ and n being a number greater than 1.

2. The apparatus according to claim 1, wherein the optical structures scatter or deflect the radiation passing through the outcoupling layer.

3. The apparatus according to claim 1, wherein the outcoupling layer has a gradient, at least in regions, along the lateral direction with regard to a local scatter effect or a local directional effect of the outcoupling layer.

4. The apparatus according to claim 1, wherein a distribution of the optical structures varies with regard to their concentration or their mean size along the lateral direction.

5. The apparatus according to claim 1, wherein a material composition of the optical structures varies along the lateral direction.

6. The apparatus according to claim 1, wherein the outcoupling layer is formed as a scattering layer, at least in regions, and wherein the optical structures of the scattering layer are scatter particles.

7. The apparatus according to claim 1, wherein the outcoupling layer is formed, at least in regions, as a microlens layer, and wherein the optical structures of the microlens layer are microlenses.

8. The apparatus according to claim 7, wherein the microlenses have different shapes along the lateral direction to achieve a variation with regard to a directional effect of the outcoupling layer.

9. The apparatus according to claim 1, wherein the organic device is formed pliantly and has a curved radiation exit surface.

10. The apparatus according to claim 1, wherein the organic device is arranged obliquely to one or more additional organic devices, wherein the one or more additional organic devices each comprise an optical cavity, wherein the outcoupling layer has a plurality of sub-regions spaced apart, and wherein the sub-regions are associated respectively with the organic device and the one or more additional organic devices.

11. The apparatus according to claim 1, wherein the organic device has a roughened radiation exit surface, the roughness of which varies along the lateral direction.

12. The apparatus according to claim 1, wherein refraction indices of adjacent layers of the organic device influence the non-Lambertian radiation distribution curve.

13. The apparatus according to claim 1, wherein the outcoupling layer is formed as a scattering layer at least in regions and the optical structures of the scattering layer are scatter particles, wherein, along the lateral direction, the outcoupling layer has a continuous gradient progression at least in regions with regard to a local scatter effect, and wherein, for achieving locally varying scatter effects, a material composition or a concentration or a geometrical size of the scatter particles varies along the lateral direction within the scattering layer.

14. The apparatus according to claim 1, wherein the radiation exit surface extends, in a lateral direction, from at least an outermost edge of the outcoupling layer to an opposing outermost edge of the outcoupling layer.

15. The apparatus according to claim 1, wherein outermost edges of the outcoupling layer, in the lateral direction, are disposed directly over, or are between, outermost edges, in the lateral direction, of the radiation exit surface.

16. The apparatus according to claim 1, wherein an entire bottommost surface of the outcoupling layer contacts, exclusively, the radiation exit surface.

17. The apparatus according to claim 1, wherein n is a number between 1.2 and 4 inclusive.

18. The apparatus according to claim 1, wherein n is a number between 2 and 4 inclusive.

19. An apparatus, comprising:
   an organic device with an optical cavity; and
   an outcoupling layer;
   wherein the optical cavity is configured to cause the organic device, during operation, to emit electromagnetic radiation through a radiation exit surface of the organic device, the electromagnetic radiation being focused in a forward direction perpendicular to a surface of the outcoupling layer facing away from the radiation exit surface;
   wherein the outcoupling layer contains optical structures;
   wherein the outcoupling layer influences the radiation passing through it in an optically varying manner by the optical structures along a lateral direction;
   wherein a radiation distribution of the focused electromagnetic radiation includes a central region with a higher radiation intensity than its surroundings, and
   wherein the radiation distribution of the focused electromagnetic radiation takes a shape of a $\cos^n(\varphi)$ curve, $\varphi$ being an observation angle in an interval between $-90°$ and $90°$ and n being a number greater than 1.

20. The apparatus according to claim 19, wherein n is a number between 1.2 and 4 inclusive.

21. The apparatus according to claim 19, wherein n is a number between 2 and 4 inclusive.

* * * * *